(12) United States Patent
Meaney et al.

(10) Patent No.: US 7,047,466 B2
(45) Date of Patent: May 16, 2006

(54) APPARATUS AND METHOD FOR PROGRAMMABLE FUSE REPAIR TO SUPPORT DYNAMIC RELOCATE AND IMPROVED CACHE TESTING

(75) Inventors: Patrick J. Meaney, Poughkeepsie, NY (US); Timothy G. McNamara, Fishkill, NY (US); Bryan L. Mechtly, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 449 days.

(21) Appl. No.: 10/161,425

(22) Filed: Jun. 3, 2002

(65) Prior Publication Data

US 2003/0226078 A1 Dec. 4, 2003

(51) Int. Cl.
*G01R 31/28* (2006.01)
*G11C 29/00* (2006.01)

(52) U.S. Cl. .................... 714/726; 714/710

(58) Field of Classification Search .............. 714/710, 714/711, 718, 719, 723, 726, 727, 733, 724
See application file for complete search history.

(56) References Cited

U.S. PATENT DOCUMENTS 6,505,305 B1 * 1/2003 Olarig ..................... 714/5
6,651,202 B1 * 11/2003 Phan ..................... 714/733

* cited by examiner

*Primary Examiner*—A Decady
*Assistant Examiner*—James Kerveros
(74) *Attorney, Agent, or Firm*—Lynn L. Augspurger

(57) ABSTRACT

An apparatus and method for allowing for dynamic wordline repair in a clock running system in addition to allowing for programmable fuse support of combined Array Built-In Self-Test (ABIST) and Logic Built-In Self-Test (LBIST) testing. The method makes use of programmable fuses which contain Level Sensitive Scan Design (LSSD) latches which also have a system port. The system port allows for simpler reading of the fuses as well as for the dynamic updates of the programmable fuses for wordline and other repairs.

7 Claims, 6 Drawing Sheets

US 7,047,466 B2

APPARATUS AND METHOD FOR PROGRAMMABLE FUSE REPAIR TO SUPPORT DYNAMIC RELOCATE AND IMPROVED CACHE TESTING

FIELD OF THE INVENTION

This invention relates to symmetrical computer systems, and particularly to cache designs with fuses, fuse controls and line delete, and particularly to an apparatus and method for programmable fuse repair to support dynamically relocating wordlines and other redundant cache circuits with clocks running as well as to support more complex test modes of operation.

Trademarks: IBM® is a registered trademarks of International Business Machines Corporation, Armonk, N.Y., U.S.A. Other names may be registered trademarks or product names of International Business Machines Corporation or other companies.

BACKGROUND

As SMP computer systems continue to improve in performance, the cache designs are growing exponentially. These larger cache sizes are making it much more likely to have soft and hard array failures. Previously, a function called set delete was added to remove cache sections that have known defects. However, much of the prior art removes a lot of sets or compartments from the cache. The prior art used in the preferred embodiment allows for the deletion of one compartment within a congruence class without a full compartment delete. However, if a wordline failure occurs, all compartments within the wordline may fail and eventually be deleted. This can lead to a system checkstop.

Another aspect of the prior art of this invention allows for the soft repairing of fuses. When cache reliability failures occur on machines that are already tested and running, it is not feasible to go back and blow more fuses for the cache failures. The prior art allowed for programmable fuse support so that when reliability failures occurred, they could be repaired later in the life of the product. Prior art allowed for separate LBIST and ABIST testing, but the combined test did not work when programmable fuse values were needed in addition to the blown fuses. Because of the prior art programmable fuse logic, there were some cache test modes that would fail with programmable fuses.

SUMMARY OF THE INVENTION

One invention allows for the updating of programmable fuses while the machine is still running. It allows use of existing cache coherency constructs like congruent class address compare and cache line purge to protect updates in the area of the cache while modified programmable fuse support logic allows for the fuses to be programmed without a machine reboot.

The invention allows for the testing of circuits using Combined Logic Built-In Self-test (LBIST) and Array Built-in Self-test (ABIST). This invention provides for programmable fuse latches that hold their values during all these complex tests. The method makes use of programmable fuses which contain Level Sensitive Scan Design (LSSD) latches which also have a system port. The system port allows for simpler reading of the fuses as well as for the dynamic updates of the programmable fuses for wordline and other repairs.

These and other improvements are set forth in the following detailed description. For a better understanding of the invention with advantages and features, refer to the description and to the drawings.

DESCRIPTION OF THE DRAWINGS

FIG. 1 illustrates prior art programmable fuse circuitry; while

FIG. 2 illustrates modified programmable fuse logic to support enhanced programmable fuse read and write and to support improved testing of array; while FIG. 3 illustrates fuse logic to additionally support dynamic wordline repair through fuse load; while FIG. 4 illustrates prior art soft repair flowchart with re-boot fuse repair; while FIG. 5 shows the preferred soft repair with dynamic programmable fuse repair high-level flowchart; while

Our detailed description explains the preferred embodiments of our invention, together with advantages and features, by way of example with reference to the drawings.

DETAILED DESCRIPTION OF THE INVENTION

Figure 1:
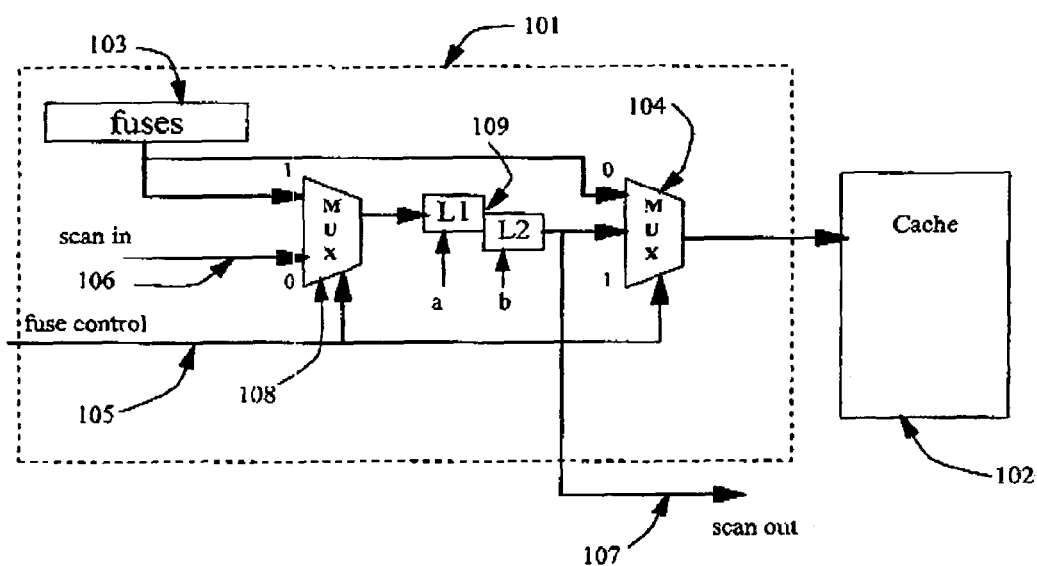

Turning to FIG. 1, notice that prior art programmable fuse support logic, 101, is used to supply fuse information to the cache, 102. Programmable fuse logic, 101, consists of fuses, 103, that connect to cache, 102, through cache fuse source multiplexer, 104, which selects between blown fuse values, 103, and programmable fuse registers, 109, using fuse control signal, 105. Programmable fuse registers, 109, are scan-only Level-Sensitive Scan Design latches which have a scan input signal, 106, and a scan output signal, 107. There is a scan source multiplexor, 108, which selects between fuses, 103, and scan in signal, 106, using said fuse control signal, 105.

Whenever the fuse control registers are being scanned, the fuse control signal, 105, is forced to '0' state, which selects the blown fuse values, 103, to the cache using cache fuse source multiplexor, 104. It also selects the scan input signal, 106, as the scan source for the programmable fuse registers, 109. This allows the programmable fuse register to be written and read out using normal LSSD scanning methods.

After the programmable fuse registers are scanned in, the fuse control signal, 105, may be set to either a '0' state or a '1' state. The '0' state is used to keep the blown fuse values, 103, as the source for the cache, 102, thereby bypassing the programmable feature. The '1' state is used to select the programmable fuse registers, 109, as the source for the cache, 102, using cache fuse source multiplexor, 104.

In this prior art example, when the blown fuses are required to be read, the procedure is a bit complicated. First, the fuse control signal, 105, is set to '1'. Then, a single 'a' clock (ie. LSSD L1 Master clock) is sent to the programmable fuse registers, 109. This causes the blown fuse values, 103, to be ingated into the programmable fuse registers, 109. The fuse control signal, 105, is then set to '0', and a normal LSSD scan is performed (using alternating 'a' clock and 'b' clock) until the fuse results are scanned out of the design through scan output, 107.

In addition to the complexity of the fuse read process, there is also a test issue. In the prior art, the fuse read procedure required that the programmable fuse registers, 109, were on a 'normal' scan ring. That means that during Logical Built-In Self-Test (LBIST) these registers get scanned to random values. The a/b clocks connected to the programmable fuse registers toggle during the LBIST load/unload sequence and will aid in scanning these registers to random values. Because of this, the fuse control signal, 105, is forced to '0' during LBIST so that the arrays experience consistent blown fuse values, 103, during the test. This is not really required since the arrays are not really used during LBIST. However, when doing a combined LBIST and ABIST, where the cache, 102, is exercised while the logic is also exercised, this random fuse value may cause the array to malfunction, since there may be known defects in the array. Therefore, the blown fuses would be required during these combined tests.

However, if a reliability problem is discovered within the cache, 102, and a programmable fuse value is required to repair it (since it is no longer feasible to blow an unused fuse, 103), there is no way to hold a programmable fuse value at the array for a combined LBIST design in the prior art, since the programmable fuse registers, 109 are getting set to random values for the LBIST sequences.

There is also no way to update the fuses while the system is running since only scan a/b clocks are used within the fuse macros. The invention solves this problem in addition to the combined LBIST/ABIST test issue and further adds the ability to read and write fuses in a simple manner.

Figure 2:
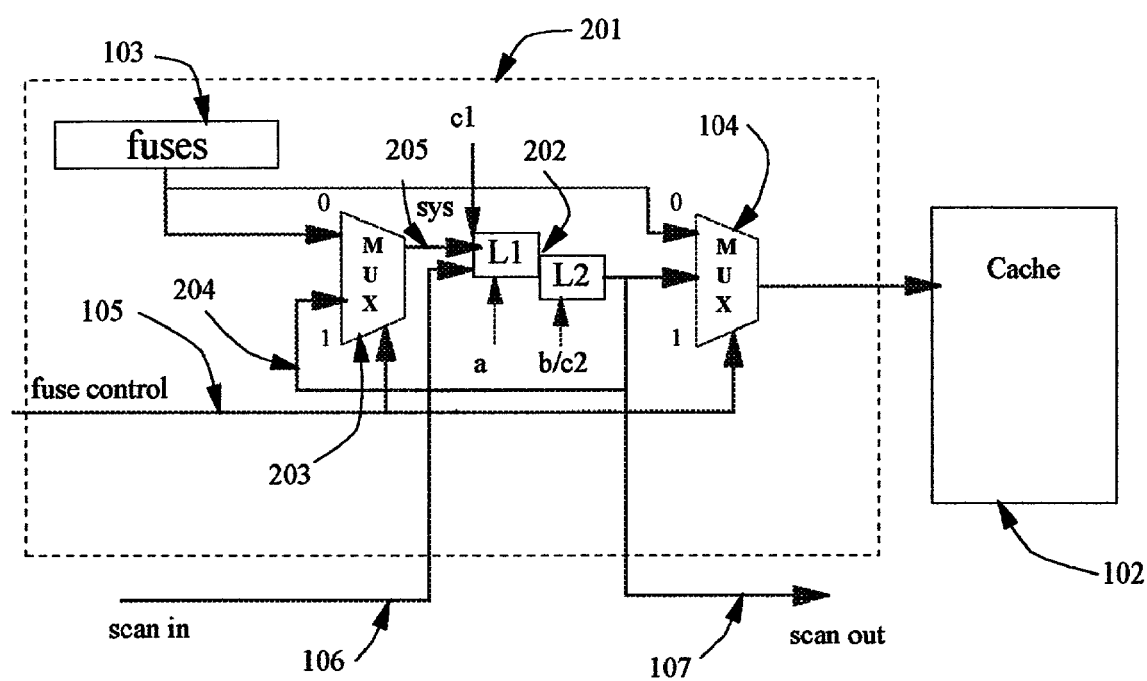

Turning to FIG. 2, notice that the modified programmable fuse support logic, 201, is similar to the prior art programmable fuse support logic, 101, with a few modification. The fuse, 103, are still connected to the cache, 102, through cache fuse source multiplexer, 104, which selects between blown fuse values, 103, and modified programmable fuse registers, 202, using fuse control signal, 105. These modified programmable fuse registers, 202, differ however from the prior art. They now contain a system port clocked by a system 'c1' clock. The scan port is directly fed by scan input signal, 106, while the register output still connects to scan output signal, 107. The system port input signal, 205, is connected to the output of latch source multiplexer, 203, which selects between blown fuse values, 103, and feedback register hold signal, 204 (which is equivalent to scan output signal, 107).

Notice that when the fuse control signal, 105, is '0', the blown fuse values, 103, are sent to the cache, 102, through cache fuse source multiplexer, 104, like the prior art. However, notice that scanning of the modified programmable fuse registers, 202, does not depend on the fuse control signal since the scan path does not have any multiplexors in it like the prior art. The only requirement is that the 'c1' clock is off, which is normal for LSSD scan operations.

Also the modified programmable fuse registers do not switch during any LBIST operations since these a/b clocks are not part of the LBIST random scanning for test sequence as in the prior art.

With the modified programmable fuse support logic, 201, the blown fuse read operation is simple. It involves setting the fuse control signal, 105, to '0', allowing the system clocks to start (which will allow the blown fuse values, 103, to be selected by the latch source multiplexer, 203, onto the system port input signal, 205, and into the modified programmable fuse registers, 202), stopping system clocks, and scanning out the modified programmable fuse registers, 202.

To override the blown fuse values, 103, the fuse control signal, 105, is simply set to '1', allowing the modified programmable fuse registers, 202, to be selected to the cache, 102, using cache source multiplexer, 104. The setting of the fuse control signal, 105, also allows for the modified programmable fuse registers, 202, to hold their values because of the feedback signal, 204, and latch source multiplexor, 203.

During all the LBIST, ABIST, and LBIST combined testing, the modified programmable fuse register, 202, can be held to any scanned value without it being corrupted by the tests.

Also notice that some prior art may have attempted this behavior, but may have required more registers for reading fuses and holding fuses for the cache, thereby using more area.

Figure 3:
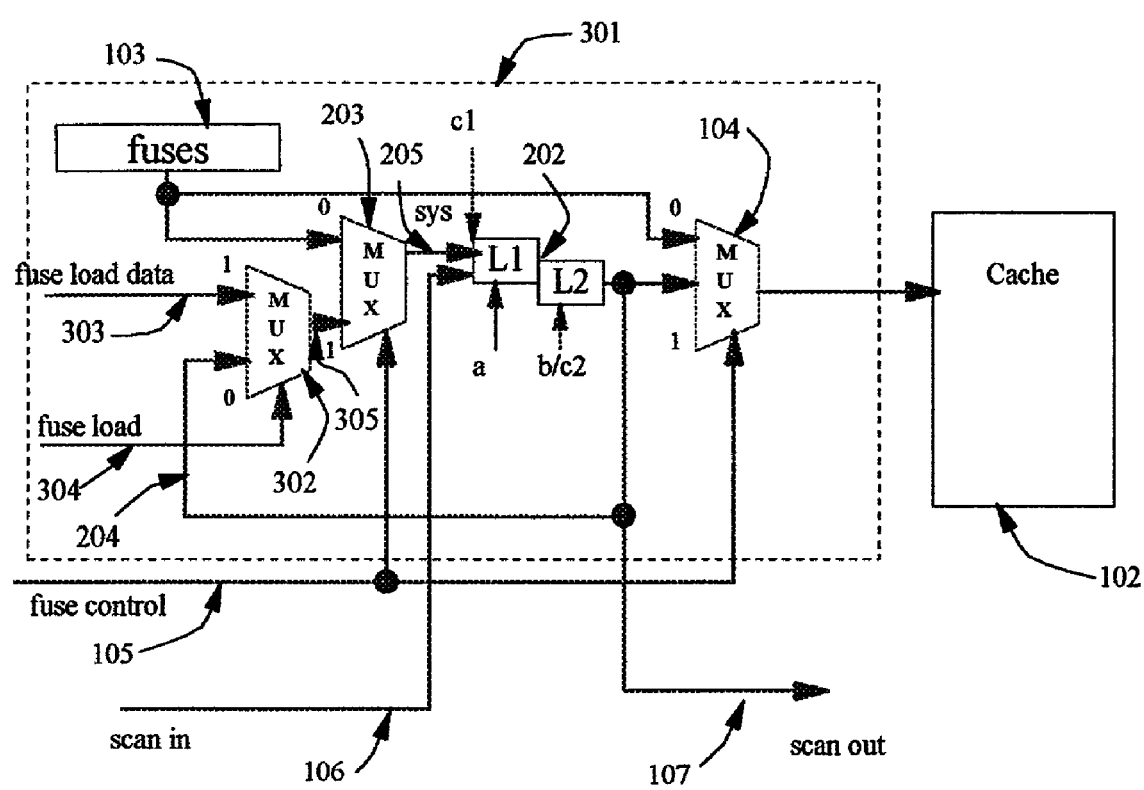

An additional aspect of the invention can be found in the preferred embodiment circuits shown in FIG. 3. Shown is preferred programmable fuse support logic, 301. It contains most of the elements of the modified programmable fuse support logic, 201, shown in FIG. 2. There is an additional fuse load multiplexor, 302, which selects between programmable fuse register hold signal, 204, and a new fuse load data bus, 303. The results of this fuse load multiplexor, 302, feed a fuse signal, 305, which replaces the hold input port of existing latch source multiplexor, 203. Therefore, when the fuse control, 105, is set to '1', the programmable fuse registers, 202, are held when the fuse load signal, 304, is '0', and get overrided to a new fuse load data value, 303, whenever the fuse load signal, 304, is set to '1'. Therefore, the apparatus in FIG. 3 will allow for a programmable fuse register to be set to a new value during system clocking operation and will then hold that new value. This is valuable for dynamic wordline relocate capabilities described in FIG. 5 and FIG. 6.

Figure 4:
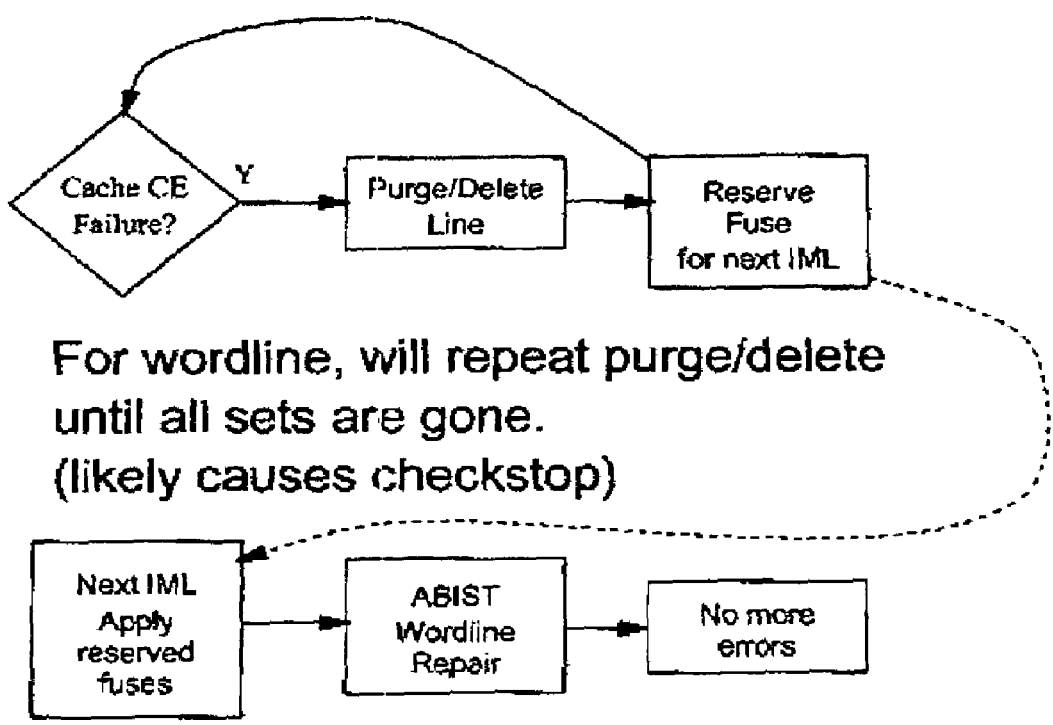

Turning to FIG. 4, shown is the prior art flowchart for programmable fuse repair which required an Initial Machine Load (IML) or re-boot of the machine to repair the cache fuses. When a cache correctable array or other failure was experienced, the design would purge the array entry (ie. cast it out to higher level cache or memory and optionally delete the line location from being used again). There would also be a record of which fuses would likely be required at the next re-boot to fix the problem. When a wordline fails, it is likely that ALL the compartments or sets in that congruence class or wordline are deleted. In many designs, this would lead to a system checkstop, even if one or two lines continued to be used. After the re-boot, the fuses could be applied, ABIST would be run, and there would likely be no detected errors. Unfortunately, the system checkstop could not be avoided in the prior art.

Figure 5:
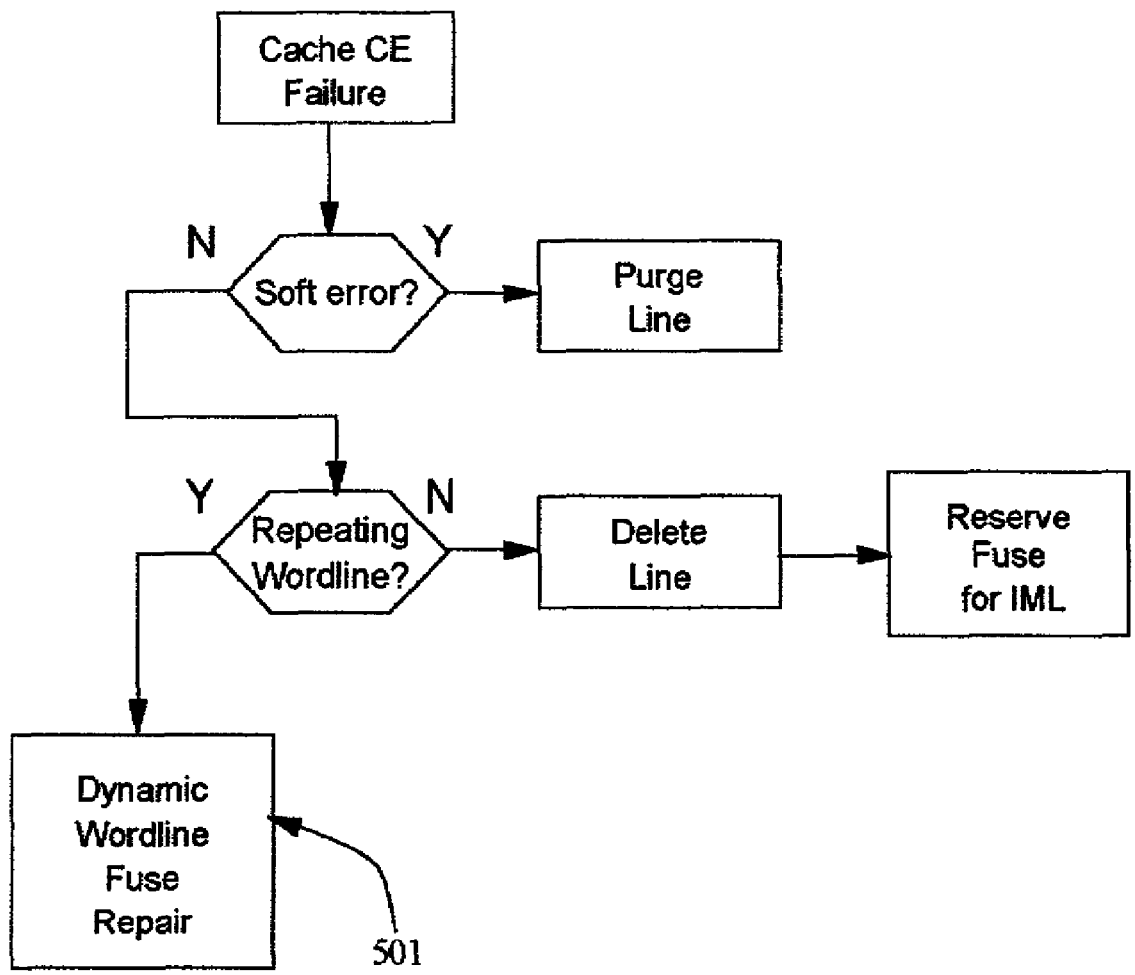

Turning to FIG. 5, shown is the high-level flowchart for dynamic wordline fuse repair. Upon detection of a cache failure (correctable error or uncorrectable error), a determination is made as to whether it is a hard or soft failure. If soft (non-repeating) a line purge will be performed. If hard, a further determination is made as to whether the wordline (or bitline or IO redundancy or any other failure which has fuse relocate capabilities) failed. If not, the line is deleted and a fuse is reserved for IML (prior art). If the wordline did fail, the dynamic wordline fuse repair step, 501, is performed, which is shown in more detail in FIG. 6.

Figure 6:
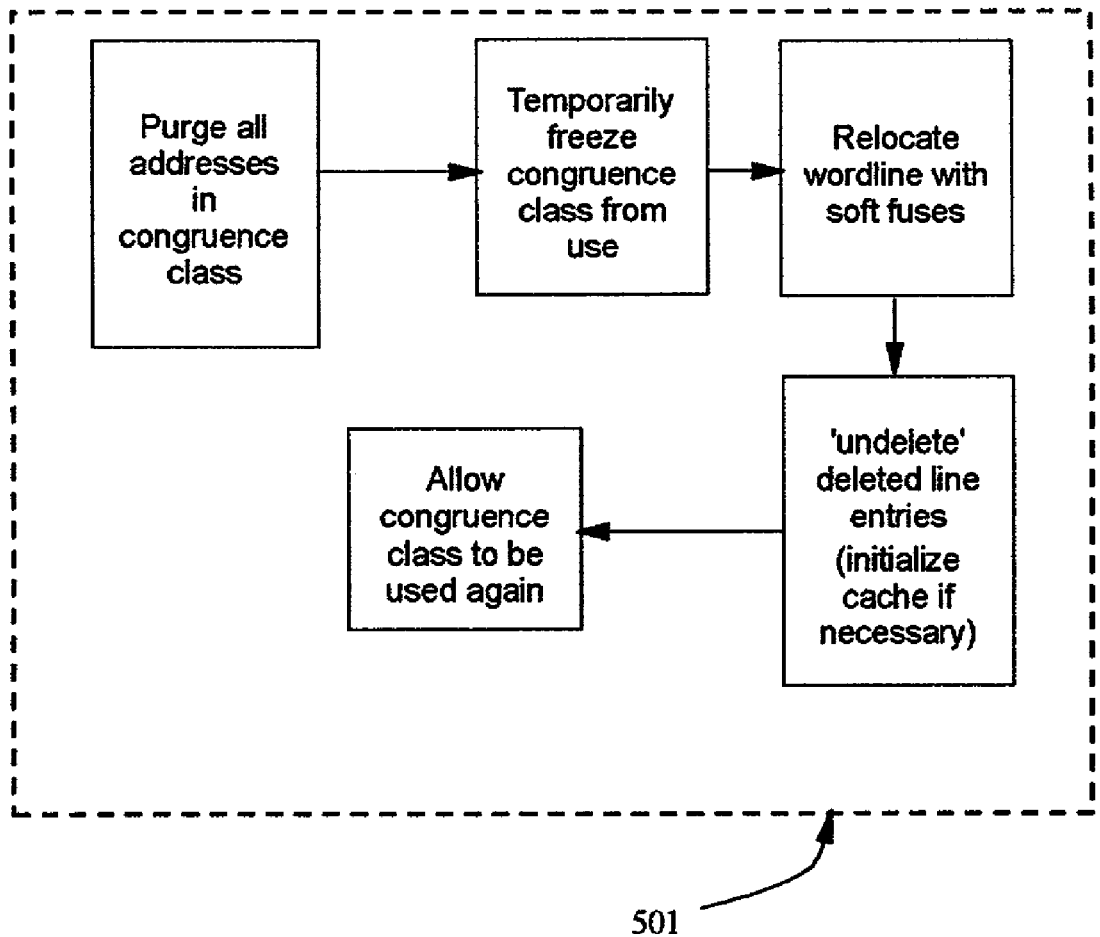
FIG. 6 shows the preferred soft repair detailed dynamic programmable fuse repair flowchart.

Turning to FIG. 6, notice the detailed flowchart for dynamic wordline fuse repair. First, all addresses that use that defective wordline are purged. In the case of an L2 Cache, the congruence class addresses that use that wordline are purged (ie invalidated if not previously changed and cast-out to L3 if previously changed). Then, the congruence class is frozen from use by all but the fuse relocation logic. Then, the programmable fuse value is determined and applied to the programmable fuse registers, 202, by setting the fuse load data, 303, and setting the fuse load signal, 304, as shown in FIG. 3. The next step is to initialize any previously deleted lines on the wordline (this is an optional step to recover any delete lines). Finally, the congruence class is free to be used again by other operations. Notice that there are no used lines with that wordline so new lines will be written to the cache, so the previous cache data on those wordlines does not have to be initialized.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. In an SMP computer system with an array and blowable fuses, an apparatus for supporting programmable fuses comprising:
   a logical level-sensitive scan design (LSSD) programmable fuse register having scan ports and a system port;
   an array source multiplexer for selecting blown fuse data or programmable fuse register data to the array; and
   a register source multiplexer for selecting blown fuse data or programmable fuse register hold data into the system port of the programmable fuse register.

2. In an SMP computer according to claim 1, wherein said array is a cache with built-in redundancy.

3. In an SMP computer having a logical level-sensitive scan design (LSSD) programmable fuse register, the method of reading of the blown fuses comprising the steps of:
   using scan ports and a system port of said programmable fuse register and an array source multiplexer and a register source multiplexer,
   selecting blown fuse data using said register source multiplexer;
   providing clocks to the system port of said programmable fuse register to capture blown fuse data into said programmable fuse register;
   shutting off clocks to the system port of said programmable fuse register; and
   providing scan clocks to read said programmable fuse register.

4. In an SMP computer having a logical-sensitive scan design (LSSD) programmable fuse register and an array, comprising the steps of:
   capturing data into a scan port for said programmable register, said scan port having data and clock inputs;
   providing scan clocks and scan pattern to set said programmable fuse register to a new fuse data value;
   selecting hold data for said programmable fuse register using a register source multiplexer; and
   selecting register data for said programmable fuse register using an array multiplexer for said array.

5. In an SMP computer according to claim 4, wherein said setting programmable fuse register comprises the additional step of providing clocks to the array and a system port of the programmable fuse register to allow the array to function with the programmable fuse data values while allowing the programmable fuse register to hold its programmed fuse data value.

6. In an SMP computer system with an array and blowable fuses, an apparatus for supporting programmable fuses comprising:
   a logical level-sensitive scan design (LSSD) programmable fuse register having scan ports and a system port;
   an array source multiplexer to select blown fuse data or programmable fuse register data to the array;
   a fuse load multiplexer to select system fuse load data or programmable fuse register hold data onto a register source bus; and
   a register source multiplexer to select blown fuse data or register source bus into the system port of the programmable fuse register.

7. In an SMP computer system with an array and blowable fuses and an apparatus for supporting programmable fuses including a logical level-sensitive scan design (LSSD) programmable fuse register, the method of loading new system fuse load data comprising the steps of:
   selecting a register source bus using a register source multiplexer;
   selecting new system fuse load data using a fuse load multiplexer; and
   after one or more clock cycles, switching said fuse load multiplexer to select hold data of said programmable fuse register, thereby holding a new programmable fuse register data value.

* * * * *